(12) United States Patent
Kim et al.

(10) Patent No.: US 7,928,555 B2
(45) Date of Patent: Apr. 19, 2011

(54) STACK SEMICONDUCTOR PACKAGE INCLUDING AN INTERPOSER CHIP HAVING AN IMPOSED DIODE OR CAPACITOR

(75) Inventors: Tae-hun Kim, Cheonan-si (KR); Heung-kyu Kwon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 984 days.

(21) Appl. No.: 11/806,589

(22) Filed: Jun. 1, 2007

(65) Prior Publication Data

US 2008/0067659 A1 Mar. 20, 2008

(30) Foreign Application Priority Data

Sep. 20, 2006 (KR) ........................ 10-2006-0091143

(51) Int. Cl.
*H01L 23/48* (2006.01)
(52) U.S. Cl. .......... 257/692; 257/68; 257/104; 257/196; 257/690; 257/691; 257/700; 257/E23.001; 257/E25.001
(58) Field of Classification Search ............ 257/68, 257/104, 196, 690, 691, 692, 700, E23.001, 257/E25.001
See application file for complete search history.

(56) References Cited

U.S. PATENT DOCUMENTS

| 6,285,084 B1 * | 9/2001 | Hikita et al. ............ 257/777 |
| 6,339,234 B1 * | 1/2002 | Takizawa ............... 257/203 |
| 7,098,528 B2 * | 8/2006 | Vasishta et al. ......... 257/668 |
| 2002/0085334 A1 | 7/2002 | Figueroa et al. |
| 2003/0153122 A1 | 8/2003 | Brooks |

FOREIGN PATENT DOCUMENTS

| KR | 1020030048250 A | 6/2003 |
| KR | 1020050074145 A | 7/2005 |

OTHER PUBLICATIONS

Taiwanese Office Action dated Aug. 5, 2010.

* cited by examiner

*Primary Examiner* — Thanh V Pham
(74) *Attorney, Agent, or Firm* — Harness, Dickey & Pierce, P.L.C.

(57) ABSTRACT

A stacked semiconductor package may include a wiring substrate. A first semiconductor chip may be disposed on the wiring substrate and wire-bonded to the wiring substrate. An interposer chip may be disposed on the wiring substrate and sire bonded to the wiring substrate. The interposer chip may include a circuit element and a bonding pad being electrically connected. A second semiconductor chip may be disposed on the interposer chip and wire-bonded to the interposer chip. The second semiconductor chip may be electrically connected to the wiring substrate through the interposer chip.

8 Claims, 4 Drawing Sheets

STACK SEMICONDUCTOR PACKAGE INCLUDING AN INTERPOSER CHIP HAVING AN IMPOSED DIODE OR CAPACITOR

PRIORITY STATEMENT

This U.S. non-provisional application claims the benefit of priority of Korean Patent Application No. 10-2006-0091143, filed on Sep. 20, 2006 in the Korean Intellectual Property Office (KIPO), the disclosure of which is incorporated herein in its entirety by reference.

BACKGROUND

1. Field

Example embodiments relate to a semiconductor package, a method of manufacturing the semiconductor package, and method of using the semiconductor package.

2. Description of the Related Art

The electronics market is currently growing in the area of mobile electronics products. Electronic components, for example, semiconductor devices, that may be installed in mobile electronics products should be lighter and smaller-sized. Accordingly, semiconductor devices have been developed that may be reduced in size; that may include several individual semiconductor devices in one semiconductor chip, which is called a system on chip (SOC); and/or that may include a plurality of semiconductor chips packaged in one semiconductor package, which is called a system in package (SIP).

According to SIP technology, a plurality of semiconductor chips is mounted on a lead frame or a substrate. The semiconductor chips are mounted horizontally or vertically with respect to a semiconductor package. SIP technology shares a similar concept with conventional multi-chip module (MCM) technology. The difference is that whereas conventional MCM technology includes mounting semiconductor chips in a horizontal direction, SIP technology includes forming a semiconductor stack package in which semiconductor chips are stacked vertically.

Meanwhile, if a semiconductor stack package is formed using conventional semiconductor chips, the positions of the pads in the semiconductor chips will be the same regardless of the type of semiconductor stack package. Thus, a number of wiring layers in a wiring substrate, for example, in a PCB, is increased. In order to reduce the number of wiring layers in the PCB, an interposer chip may be stacked between the semiconductor chips.

However, a conventional interposer chip includes only an input/output (I/O) bonding pad for connecting upper and lower semiconductor chips. Thus, if the bonding pad of the interposer chip is wire-bonded, for example, with gold, it may not be detected whether the wire-bonding was successful.

For example, non-stick defects may occur in which a wire is not properly bonded to a bonding pad of an interposer chip. If a non-stick defect occurs, it will be determined that all of the semiconductor chips are defective, rather than the discovering the defective wire-bond. Accordingly, the yield of the semiconductor stack package will be decreased. Also, if wire-bonding defects in the bonding pad of the interposer chip are not detected, the semiconductor stack package may proceed to a subsequent process, thus increasing the burden in performing further testing, which in turn may increase the cost.

SUMMARY

Example embodiments may provide a stacked semiconductor package including an interposer chip that enables wire-bond monitoring.

Example embodiments may provide a method of manufacturing a stacked semiconductor package which enables wire-bond monitoring of an interposer chip.

In an example embodiment, a stacked semiconductor package may include a wiring substrate. A first semiconductor chip may be disposed on the wiring substrate and wire-bonded to the wiring substrate. An interposer chip may be disposed on the first semiconductor chip and wire-bonded to the wiring substrate. The interposer chip may include a circuit element and a bonding pad being electrically connected. A second semiconductor chip may be disposed on the interposer chip and wire-bonded to the interposer chip, the second semiconductor chip being electrically connected to the wiring substrate through the interposer chip.

According to an example embodiment, the circuit element may be connected to a grounding pad or a grounding line.

According to an example embodiment, the circuit element may be a diode.

According to an example embodiment, the circuit element may be a capacitor.

In an example embodiment, a method of manufacturing a stacked semiconductor package may include disposing a first semiconductor chip on a wiring substrate; wire-bonding the first semiconductor chip to the wiring substrate; disposing an interposer chip on the first semiconductor chip, the interposer chip including a circuit element and a bonding pad being electrically connected; wire-bonding a bonding pad of the interposer chip and the wiring substrate; disposing a second semiconductor chip on the interposer chip; and wire-bonding the second semiconductor chip to the bonding pad of the interposer chip to electrically connect the second semiconductor chip to the wiring substrate.

According to an example embodiment, the method may include connecting the circuit element to a grounding pad or a grounding line.

According to an example embodiment, the circuit element may be a diode.

According to an example embodiment, the circuit element may be a capacitor.

In an example embodiment, a method of monitoring a wire-bond of a stacked semiconductor package, the method may include applying a current to the bonding pad of the interposer chip; measuring one of a current or voltage of the circuit element; and comparing the measured current or voltage of the circuit element to a reference current or voltage, respectively According to an example embodiment, the circuit element may be a diode, and applying the current may include applying a direct current to the bonding pad of the interposer chip.

According to an example embodiment, the circuit element may be a capacitor, and applying the current may include applying an alternating current to the bonding pad of the interposer chip.

BRIEF DESCRIPTION OF THE DRAWINGS

Example embodiments will be described with reference to the accompanying drawings.

DESCRIPTION OF EXAMPLE EMBODIMENTS

Figure 1:
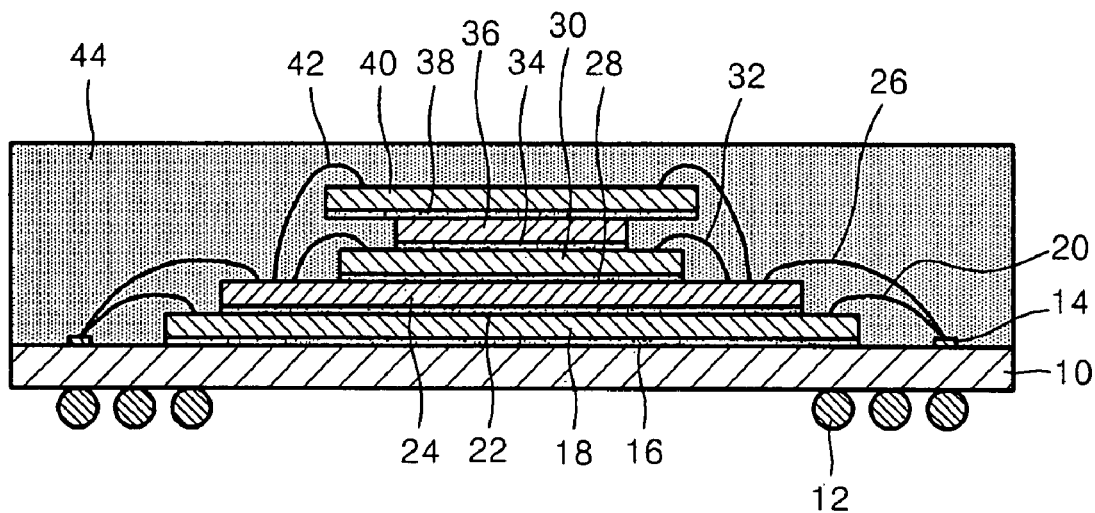
FIG. 1 is a cross-sectional view of a stacked semiconductor package according to an example embodiment.

Example embodiments will now be described more fully with reference to the accompanying drawings. Example embodiments may, however, be embodied in many different forms and should not be construed as being limited to the example embodiments set forth herein. Rather, these example embodiments are provided so that this disclosure will be thorough, and will fully convey the concept of the invention to those skilled in the art. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms used herein should be interpreted as having a meaning that is consistent with their meaning in the context of this specification and the relevant art and will not be interpreted in an idealized or overly formal sense unless expressly so defined herein.

According to an example embodiment, a stacked semiconductor package may include an interposer chip that enables monitoring of wire-bonding. The stacked semiconductor package may include a plurality of semiconductor chips on a wiring substrate, for example, three or more semiconductor chips. The stacked semiconductor package may include an interposer chip. The stacked semiconductor package may be applied regardless of the stack position, the size of the interposer chip, the method of stacking the interposer chip, the form of the package, and/or the size or form of the semiconductor chip. An interposer chip may be applied between the semiconductor chips of the stacked semiconductor package regardless of whether the semiconductor chips are stacked vertically, horizontally, or a vertically stacked semiconductor chip stack is arranged in parallel.

Figure 2:
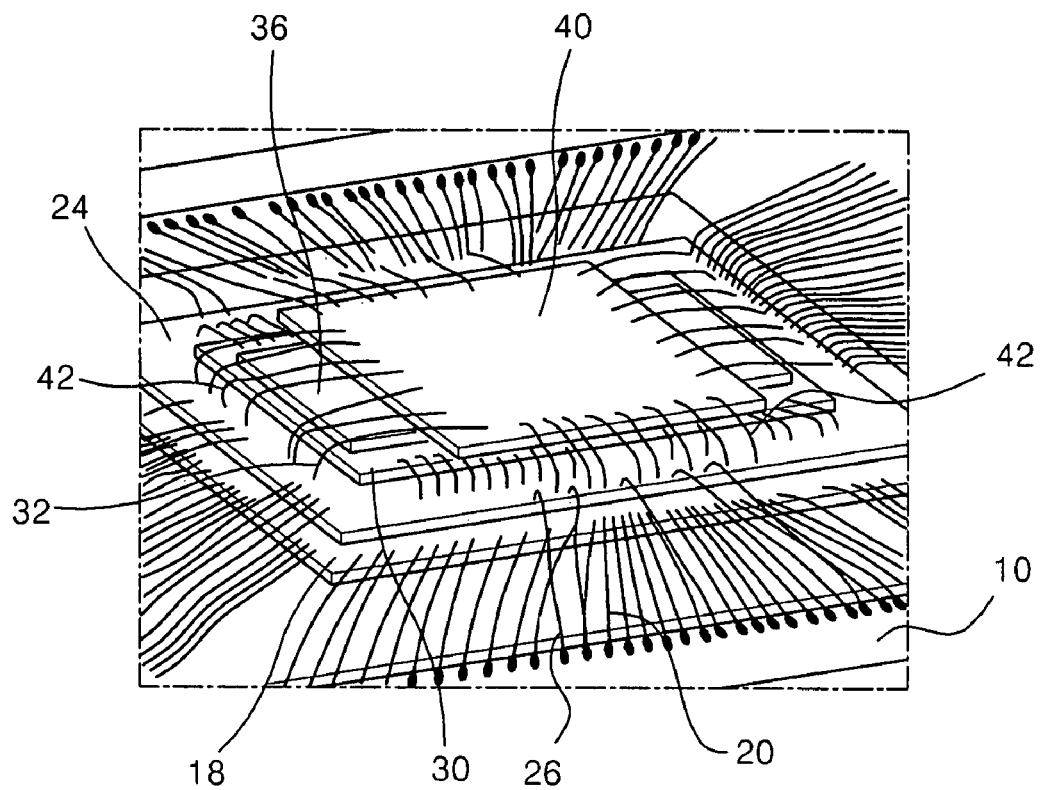
FIG. 2 is a perspective view of the stacked semiconductor package of FIG. 1.

FIG. 1 is a cross-sectional view of a stacked semiconductor package according to an example embodiment. FIG. 2 is a perspective view of the stacked semiconductor package of FIG. 1.

A stacked semiconductor package may include a wiring substrate 10. Lead 14 may be formed on an upper surface of the wiring substrate 10. Conductive bumps, for example, solder balls 12, may be formed on a lower surface of the wiring substrate 10.

A first semiconductor chip 18 may be disposed on the wiring substrate 10. A first adhesion layer 16 may be interposed between the wiring substrate 10 and the first semiconductor chip 18. A first bonding wire 20 may be wire-bonded to a wiring pad (not shown) of the first semiconductor chip 18 and the leads 14 of the wiring substrate 10.

An interposer chip 24 may be disposed on the first semiconductor chip 18. A second adhesion layer 22 may be interposed between the first semiconductor chip 18 and the interposer chip 24. A bonding pad (not shown) of the interposer chip 24 and the leads 14 of the wiring substrate 10 are wire-bonded with a second bonding wire 26.

If a pad (or alternatively, a pin, ball, or lead) for signal, power, and/or grounding of a stack package is integrated in the interposer chip 24, the interposer chip 24 may reduce the wiring layer in the wiring substrate 10. If each semiconductor chip is wire-bonded, the interposer may reduce the length of the wiring. A circuit element (not shown), for example, a diode or a capacitor, may be connected to a bonding pad (not shown) of the interposer chip 24 to produce a polarity and a current flow if the interposer chip 24 is wire-bonded to a bonding pad (not shown). Thus, the circuit element may enable wire-bond monitoring, which will be described below in more detail.

A second semiconductor chip 30 may be disposed on the interposer chip 24. A third adhesion layer 28 may be interposed between the interposer chip 24 and the second semiconductor chip 30. A bonding pad (not shown) of the second semiconductor chip 30 and a bonding pad (not shown) of the interposer chip 24 may be wire-bonded with a third bonding wire 32. The second semiconductor chip 30 may be electrically connected to the wiring substrate 10 through the interposer chip 24. A spacer 36 may be disposed on the second semiconductor chip 30. A fourth adhesion layer 34 may be interposed between the second semiconductor chip 30 and the spacer 36. The spacer 36 may facilitate wire-bond a third semiconductor chip 40, to be subsequently attached.

A third semiconductor chip 40 may be disposed on the spacer 36. A fifth adhesion layer 38 may be interposed between the spacer 36 and the third semiconductor chip 40. A fourth bonding wire 42 may be wire-bonded to a bonding pad (not shown) of the third semiconductor chip 40 and a bonding pad (not shown) of the interposer chip 24. The third semiconductor chip 40 may be electrically connected to the wiring substrate 10 through the interposer chip 24. As described above, the interposer chip 24 may be an intermediate to electrically connect the second and third semiconductor chips 30 and 40 and the wiring substrate 10. An encapsulant 44 may be formed to protect and cover the first, second, and third semiconductor chips 18, 30, 40, the interposer chip 24, and the spacer 36. For example, the encapsulant 44 may be an epoxy resin.

According to an example embodiment, as shown in FIG. 1, the second semiconductor chip 30 and the third semiconductor chip 40, which are stacked vertically on the interposer chip 24, may be electrically connected to the wiring substrate 10. In another example embodiment, the second semiconductor chip 30 and the third semiconductor chip 40, which are stacked horizontally, may be electrically connected to the wiring substrate 10.

Referring to FIG. 1, a method of manufacturing a stacked semiconductor package, according to an example embodiment, may include disposing a first semiconductor chip 18 on a wiring substrate 10. The first semiconductor chip 18 may be wire-bonded to the wiring substrate 10 using a first bonding wire 20. An interposer chip 24 may be disposed on the first semiconductor chip 18. The interposer chip 24 may include a circuit element that may have a polarity and a current flow. A bonding pad of the interposer chip 24 may be wire-bonded to the wiring substrate 10 using a second bonding wire 26.

A second semiconductor chip 30 may be disposed on the interposer chip 24. The second semiconductor chip 30 may be wire-bonded to a bonding pad of the interposer chip 24 using the third bonding wire 32 to electrically connect to the wiring substrate 10. A spacer 36 may be disposed on the second semiconductor chip 30. A third semiconductor chip 40 may be disposed on the spacer 36. The third semiconductor chip 40 may be wire-bonded to a bonding pad of the interposer chip 24 using a fourth bonding wire 42 to electrically connect the third semiconductor chip 40 to the wiring substrate 10. An encapsulant 44 may be formed to cover the first, second, and third semiconductor chips 18, 30 and 40, the interposer chip 24, and the spacer 36. For example, the encapsulant 44 may be an epoxy resin.

Wire monitoring may be performed on the second, third, and fourth bonding wires 26, 42 and 42 that are wire-bonded to a bonding pad of the interposer chip 24.

In the example embodiment described above, with reference to FIG. 1, the method may include disposing each of the first, second, and third semiconductor chips 18, 30, and 40 and the interposer chip 24, and then wire-bonding each element. However, in another example embodiment, a method may include directly attaching the first, second, and third semiconductor chips 18, 30, and 40, the interposer chip 24, and the spacer 36 to the wiring substrate 10, depending on the size of each semiconductor chip and/or the interposer chip 24, and wire-bonded at the same time.

Figure 3:
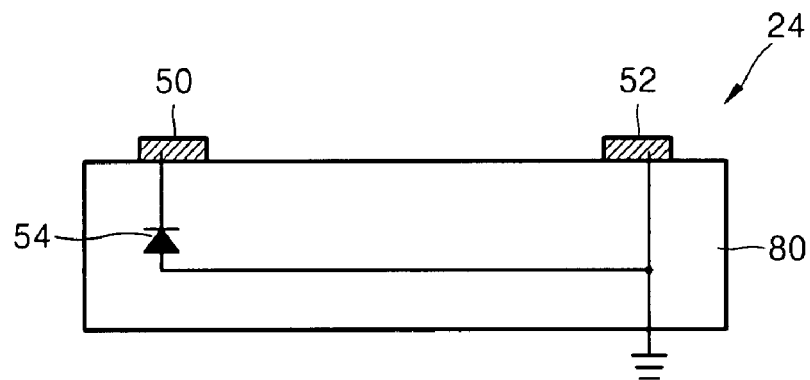
FIGS. 3 and 4 are schematic views of an interposer chip according to an example embodiment.
Figure 4:
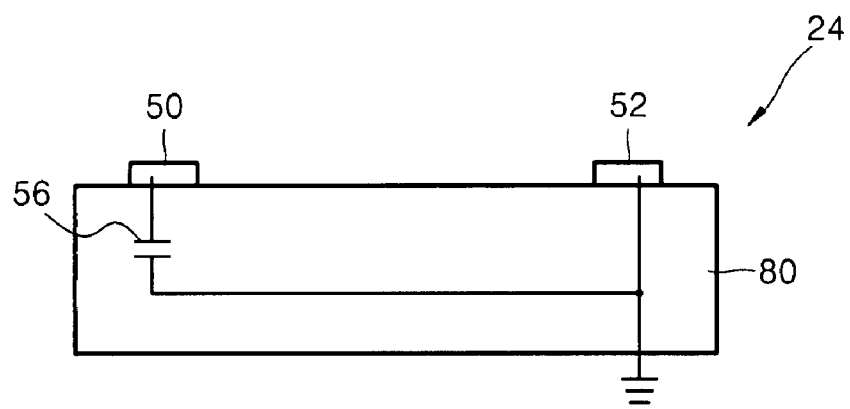
Figure 5:
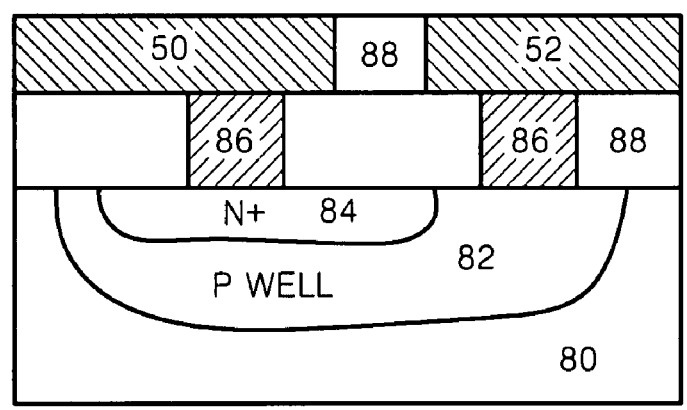
FIG. 5 is a cross-sectional view of an interposer chip according to an example embodiment.
Figure 6:
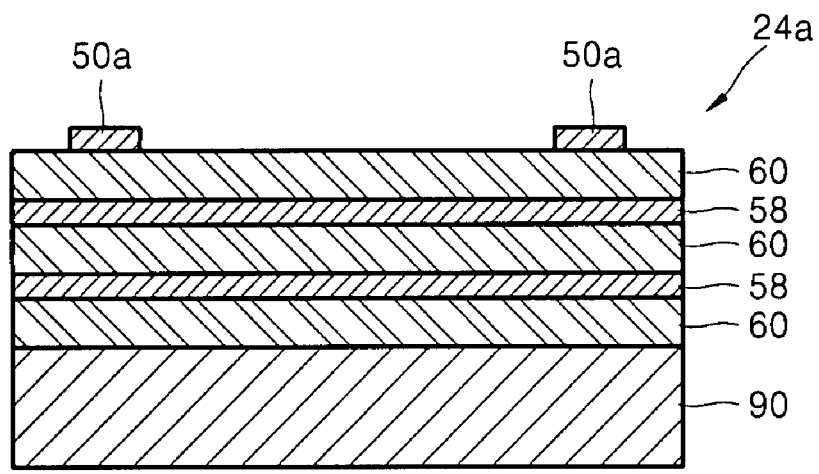
FIG. 6 is a cross-sectional view of a conventional interposer chip.

FIGS. 3 and 4 are schematic views of an interposer chip according to an example embodiment. FIG. 5 is a cross-sectional view of an interposer chip according to an example embodiment. FIG. 6 is a cross-sectional view of a conventional interposer chip.

Referring to FIGS. 3 to 5, an interposer chip 24 may include a circuit element, for example, a diode 54 or a capacitor 56. A bonding pad 50 may be connected to the circuit element. The circuit element may have a polarity and may cause a current to flow through the silicon substrate 80. The circuit element may be connected to a grounding pad 52 or grounding line.

Referring to FIGS. 3 and 5, the bonding pad 50 may be connected to a diode 54 formed in the silicon substrate 80. The diode 54 may be an N-P type diode including a P well 82 (P type impurities) and an N+ well (N type impurities). The N-P type diode 54 may be connected to a grounding pad 52 or a grounding line. The N-P type diode 54 is may be connected to the silicon substrate 80 below the bonding pad 50.

Referring to FIG. 5, a P well 82 may be formed in the silicon substrate 80. An N+ well 84 may be formed in the P well 82, such that only the P well 82 may be grounded to the silicon substrate 80. The N+ well and P well may be formed in a portion of the substrate 80 below where the bonding pad 50 is to be formed. The P well 82 may extend below where the grounding pad 52 is to be formed.

An interlayer insulating layer 88 may be formed on the surface of the silicon substrate 80. The bonding pad 50 and the grounding pad 52 may be formed on the interlayer insulating layer 88. Contact plugs 86 may be formed in the interlayer insulating layer 88 to connect the N+ well 84 to the bonding pad 50 and the P well 82 to the grounding pad 52.

A bonding wire may be wire-bonded to the bonding pad 50, and a voltage may be applied to the bonding pad 50 to perform wire-bond monitoring.

If the diode 54 is an N-P type diode, as shown in FIG. 5, a greater voltage may be applied to the grounding pad 52 than to the bonding pad 50, producing a current that flows from the grounding pad 52 to the bonding pad 50, thereby enabling wire-bond monitoring.

If the diode 54 is a P-N type diode (not shown), a greater voltage may be applied to the bonding pad 50 than to the grounding pad 52, producing a current flows from the bonding pad 50 to the grounding pad 52, thereby enabling wire-bond monitoring.

Referring to FIG. 4, the bonding pad 50 may be connected to a capacitor 56 formed in the silicon substrate 80. The capacitor 56 may be connected to a grounding pad 52 or a grounding line. Accordingly, if a bonding wire is wire-bonded to the bonding pad 50, there may be a polarity between the grounding pad 52 and the bonding pad 50 due to the capacitor 56, and current may flow through the capacitor 56, thereby enabling wire-bond monitoring.

In contrast, in a conventional interposer chip 24a illustrated in FIG. 6, an insulating layer 60 and a metal layer 58 may be sequentially formed on a silicon substrate 90. A bonding pad 50a may be disposed on the upper layer. For example, the boding pad 50a may be formed of the same material as the metal layer 58. The insulating layer 60 may be formed to a thickness of about 9000 Å, and the metal layer 58 and/or the bonding pad 50a may be formed to a thickness of 5700 Å.

Accordingly, because a conventional interposer chip 24a includes a bonding pad 50a which does not have a polarity and is not grounded, current may not flow through if a bonding wire is wire-bonded to the bonding pad 50a. Thus, wire-bond monitoring may not be possible.

Figure 7:
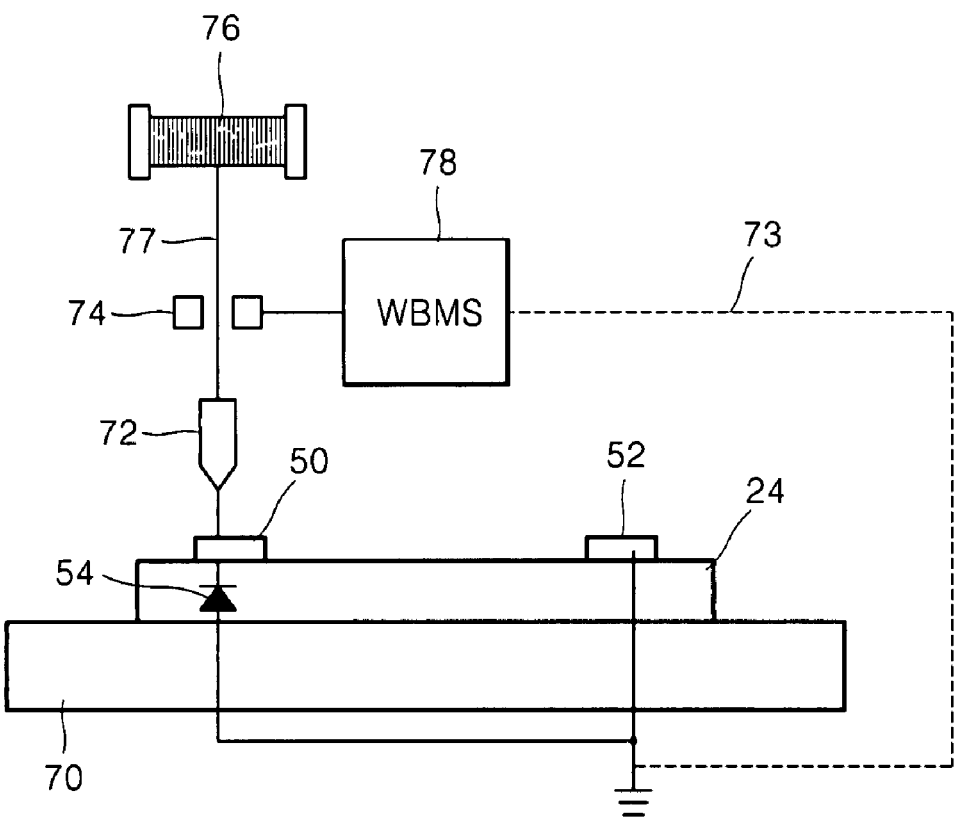
FIGS. 7 and 8 are schematic views illustrating monitoring of wire-bonding of an interposer chip of a stacked semiconductor package.
Figure 8:
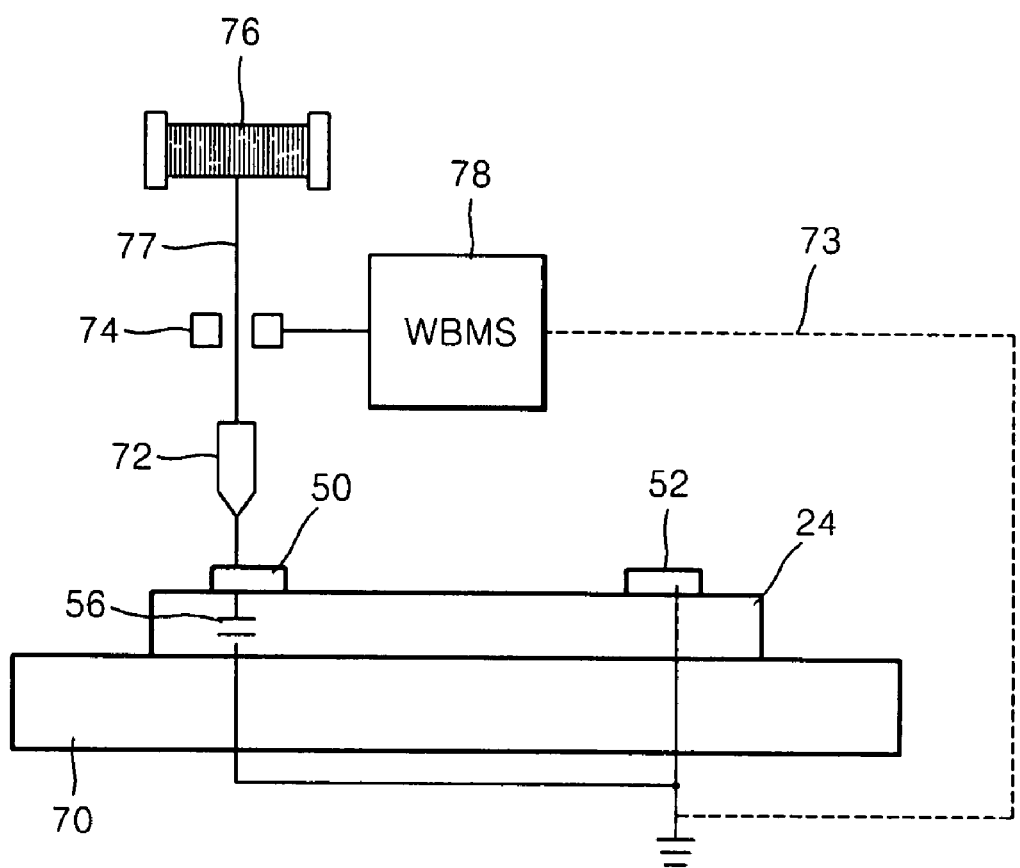

FIGS. 7 and 8 are schematic views illustrating a wire-bond monitoring method for an interposer chip of a stacked semiconductor package, according to an example embodiment.

Referring to FIGS. 7 and 8, a wire-bonding apparatus may include a wire-bond monitoring system (WBMS). For convenience, the wire-bond monitoring of the bonding pad 50 will be described with reference to an interposer chip 24 disposed on a heater block 70. In FIG. 7, a diode 54 may be connected to the bonding pad 50 of an interposer chip 24, according to an example embodiment as shown in FIGS. 3 and 5. In FIG. 8, a capacitor 56 may be connected to the bonding pad 50 of the interposer chip 24, according to an example embodiment as shown in FIG. 6.

A wire 77 that is drawn out from a wire spool 76 of the wire-bonding apparatus illustrated in FIGS. 7 and 8 may be inserted into a capillary 72 through a wire clamp 74. The wire 77 inserted into the capillary 72 may be wire-bonded to the bonding pad 50 of the interposer chip 24, for example, by ball bonding. A current, e.g., either a direct or alternating current, may be applied to the wire 77 through the wire clamp 74 in the wire-bond monitoring system. The current or voltage flowing through the circuit element, e.g., the diode 54 or the capacitor 56, may be checked to determine whether the wire-bond is bonded properly to the bonding pad 50. Accordingly, non-stick defects, e.g., defective bonding of the bonding pad 50 and a bonding wire, may be detected.

Referring to FIG. 7, a direct current may be applied to the wire 77 through the wire clamp 74 in the wire-bond monitoring system 78 as described above. If a direct current is applied to the wire 77, and the direct current applies a greater voltage to the grounding pad 52 than to the bonding pad 50, current may flow from the grounding pad 52 to the bonding pad 50. The current may be fed back to the wire 77 and the clamp 74 to check the current or the voltage in the wire-bond monitoring system 78 to monitor the wire-bond.

During the checking of the current (or the voltage), a reference current (or a reference voltage) stored in the wire-bond monitoring system 78 and the checked current (or voltage) may be compared. Alternatively, the checked currents (or voltages) may be compared using a plurality of bonding pads of the interposer chip 24 in the wire-bond monitoring system 78. Thus, it may be determined whether the wire-bond is bonded properly to the bonding pad 50.

If the diode 54 is a P-N type diode, and a greater voltage is applied to the bonding pad 50 than to the grounding pad 52 by the direct current, current may flow from the bonding pad 50 to the grounding pad 52. The current may be checked in the wire-bond monitoring system 78 using a connection line 73, represented as a dotted line in FIG. 7, to determine whether the wire-bonding is properly bonded to the bonding pad 50.

For example, if wire-bond monitoring is performed by applying direct current to the bonding pad 50 of the interposer chip 24, the resistance and the current of the diode 54 may be a less than about 8 Mohm and 2 µA, respectively.

Referring to FIG. 8, an alternating current may be applied to the wire 77 through the wire clamp 74 in the wire-bond monitoring system 78. If an alternating current is applied to the wire 77, there may be a polarity between the bonding pad 50 and the grounding pad 52, between which current may flow. The current or the voltage fed back to the wire clamp 74 in the wire-bond monitoring system 78 may be checked to monitor the wire-bond. The checking method may be performed as described before with reference to FIG. 7.

Wire-bond monitoring may be performed by checking current or voltage in the wire-bond monitoring system 78 through a connection line 73 connected to the grounding pad 52. For example, if the wire-bond monitoring is performed by applying an alternating current to the bonding pad 50 of the interposer chip 24, the capacitance of the capacitor 56 may be about 15 to 20 pF.

According to example embodiments, wire-bond monitoring may be performed in a stacked semiconductor package by connecting a circuit element, for example, a diode or a capacitor, that may have a polarity and may cause current to flow to a bonding pad of an interposer chip.

According to example embodiments, a stacked semiconductor package may include a circuit element in which a wire may have a polarity and may cause a current flow to a bonding pad of an interposer chip. Thus, non-stick defects, e.g., a bonding wire that is not properly bonded during wire-bonding, may be detected.

Accordingly, cases in which all semiconductor chips in a stacked semiconductor package are determined to be defective may be reduced or prevented, thereby increasing yield and reducing the burden of testing in subsequent processes.

While the example embodiments have been particularly shown and described, it will be understood by those of ordinary skill in the art that various changes in form and details may be made therein without departing from the spirit and scope of the present invention.

What is claimed is:

1. A stacked semiconductor package comprising:
    a wiring substrate;
    a first semiconductor chip disposed on the wiring substrate and wire-bonded to the wiring substrate;
    an interposer chip disposed on the first semiconductor chip and wire-bonded to the wiring substrate, the interposer chip including a diode and a bonding pad being electrically connected; and
    a second semiconductor chip disposed on the interposer chip and wire-bonded to the interposer chip, the second semiconductor chip being electrically connected to the wiring substrate through the interposer chip, wherein the diode is connected to a grounding pad or a grounding line of the interposer chip and the diode includes,
    a P well formed below the bonding pad and the grounding pad in the interposer chip, the P well being electrically connected to the grounding pad, and
    an N+ well formed below the bonding pad in the P well, the N+ well being electrically connected to the bonding pad.

2. The stacked semiconductor package of claim 1, wherein the circuit element is connected to a grounding pad or a grounding line of the interposer chip.

3. The stacked semiconductor package of claim 1, wherein a resistance of the diode is less than about 8 MOhm.

4. The stacked semiconductor package of claim 1, wherein the first semiconductor chip, interposer, and second semiconductor chip are stacked horizontally on the wiring substrate.

5. The stacked semiconductor package of claim 1, wherein the first semiconductor chip, interposer, and second semiconductor chip are stacked vertically on the wiring substrate.

6. The stacked semiconductor package of claim 1, further comprising:
a third semiconductor chip on the second semiconductor chip and wire-bonded to the interposer chip.

7. A stacked semiconductor package, comprising:
a wiring substrate;
a first semiconductor chip disposed on the wiring substrate and wire-bonded to the wiring substrate;
an interposer chip disposed on the first semiconductor chip and wire-bonded to the wiring substrate, the interposer chip including a capacitor and a bonding pad being electrically connected; and
a second semiconductor chip disposed on the interposer chip and wire-bonded to the interposer chip, the second semiconductor chip being electrically connected to the wiring substrate through the interposer chip, wherein
the capacitor is connected to a grounding pad or a grounding line of the interposer chip, and
a capacitance of the capacitor is about 15 to 20 pF.

8. The stacked semiconductor package of claim 7, further comprising:
a third semiconductor chip on the second semiconductor chip and wire-bonded to the interposer chip.

* * * * *